(12) United States Patent
Chang

(10) Patent No.: US 7,032,653 B1
(45) Date of Patent: Apr. 25, 2006

(54) TOWER-TYPE HEAT PIPE AND METHOD FOR MAKING THE SAME

(75) Inventor: Chang-Shen Chang, Tu-Cheng (TW)

(73) Assignee: Foxconn Technology Co., Ltd., (TW)

( * ) Notice: Subject to any disclaimer, the term of this patent is extended or adjusted under 35 U.S.C. 154(b) by 0 days.

(21) Appl. No.: 11/214,556

(22) Filed: Aug. 30, 2005

(30) Foreign Application Priority Data

Jan. 14, 2005 (TW) ................ 94101104 A

(51) Int. Cl.
*F28D 15/00* (2006.01)

(52) U.S. Cl. .................. 165/104.26; 165/104.33; 361/700; 361/697; 174/15.2; 257/714

(58) Field of Classification Search ........... 165/104.33, 165/104.21, 104.26, 80.4, 80.3, 185; 361/697, 361/699, 700, 704; 174/15.2; 257/714–716
See application file for complete search history.

(56) References Cited

U.S. PATENT DOCUMENTS

| | | | | |
|---|---|---|---|---|
| 2,958,021 A * | 10/1960 | Cornelison et al. | ......... | 257/715 |
| 5,582,242 A * | 12/1996 | Hamburgen et al. | ... | 165/104.21 |
| 5,632,158 A * | 5/1997 | Tajima | .............. | 62/259.2 |
| 6,336,497 B1 * | 1/2002 | Lin | ................. | 165/80.3 |
| 6,725,909 B1 * | 4/2004 | Luo | ............... | 165/104.21 |
| 6,793,009 B1 * | 9/2004 | Sarraf | ............ | 165/104.33 |
| 6,827,133 B1 * | 12/2004 | Luo | ............... | 165/104.21 |
| 6,907,918 B1 * | 6/2005 | Connors et al. | ....... | 165/104.26 |
| 2005/0019234 A1 * | 1/2005 | Luo | ............... | 422/198 |
| 2005/0199374 A1 * | 9/2005 | Hsu | ............... | 165/104.26 |
| 2005/0199375 A1 * | 9/2005 | Hsu | ............... | 165/104.26 |
| 2005/0224215 A1 * | 10/2005 | Hsu | ............... | 165/104.26 |
| 2005/0224216 A1 * | 10/2005 | Hsu | ............... | 165/104.26 |
| 2005/0247436 A1 * | 11/2005 | Hsu | ............... | 165/104.26 |

FOREIGN PATENT DOCUMENTS

JP         53-22650        *  3/1978  ............ 165/104.26

* cited by examiner

*Primary Examiner*—Terrell Mckinnon
(74) *Attorney, Agent, or Firm*—Morris Manning & Martin; Tim Tingkang Xia, Esq.

(57) ABSTRACT

A tower-type heat pipe (10) includes a metal plate (20), a heat pipe with a container (30) and a wick (32), and a cover (40). The heat pipe is vertically mounted on the metal plate. A solder (50) is used to soldering an outer wall of the container with the metal plate and a top of the container with the cover. An air gap (27) is defined in the metal plate and located between the solder and the wick along a flowing path of the solder in order to prevent the solder from flowing into an inside of the container to contaminate the wick.

15 Claims, 3 Drawing Sheets

TOWER-TYPE HEAT PIPE AND METHOD FOR MAKING THE SAME

BACKGROUND

1. Field

The present invention relates generally to a high-performance cooling device for electronic components, and more particularly to an improved tower-type heat pipe and method for making the heat pipe.

2. Prior Art

As the functions and speeds of computer electronic devices such as central processing units (CPUs) are quickly developed, those electric elements generate lots of heat during routine operation. If not properly removed, such heat can adversely affect the operational stability of computers or those electric components may get destroyed. Solutions must be taken to efficiently remove the heat from those electric components. Typically, a cooling device is mounted on those heat-generating devices to remove the heat.

In order to take more heat out of those electric components in a quick manner, heat pipes are widely used in computer industry recently. A heat pipe is a sealed element in which heat is transferred by evaporation, vapor movement and condensation. When the heat pipe contacts the heat source, working fluid in the evaporator region absorbs heat getting into vapor, and then moves toward condenser region. Then the working fluid in vapor state dissipating heat out returns into liquid again. Finally, the liquid passes back to the evaporator region through the wick in the heat pipe. By repeating this cycle, the heat pipe can take large amounts of heat from the heat source.

A tower-type heat pipe is a heat pipe for being vertically mounted on the heat source which generally is a CPU of a computer. The tower-type heat pipe has a base metal plate and a pipe vertically projecting upwardly from the base plate. The base metal plate is used for contacting with the CPU and the pipe is used as a heat pipe. A conventional method for fabricating the tower-type heat pipe is to integrally forge the plate and the pipe. Such a method has the advantage that the pipe and the base metal plate are seamlessly connected together; thus, no leaking will occur between the pipe and the base. However the cost of this method is too high to be widely acceptable. An alternative conventional method is to form the pipe and the metal plate separately, and then solder the heat pipe and metal plate together. This method includes the follow steps. First, a metal plate and a round container with both open ends are prepared. Second, the container is vertically mounted to the metal plate. Third, a wick formed by sintering copper powders or a mesh is formed on an inner wall of the container. Thereafter a soldering process is done to solder a cover to a top of the container and to solder the container to the metal plate. The container is soldered to the metal plate by applying the solder to an outer wall of the container at a bottom end thereof and a top surface of the metal plate. Then, working fluid is injected into the container, and the container is vacuumed through a tube in the cover. Finally, the tube is sealed. Although this method can reduce the manufacturing cost, it has the disadvantage that when the container is soldered to the metal plate, solder may flow through an interface between the bottom end of the container and the top surface of the metal plate into the container to contaminate the wick formed in the container. This disadvantage causes the tower-type heat pipe made by this method can not have a satisfied yield rate.

To solve the aforesaid drawbacks of the prior art, the present invention proposes a tower-type heat pipe and a method for making the same which have the advantages of low manufacturing cost and high yield rate.

SUMMARY

A tower-type heat pipe in accordance with a preferred embodiment of the present invention comprises of a metal plate, a heat pipe with a container and a wick, a cover, and an air gap. The heat pipe with a top cover sealed is vertically mounted on the metal plate. A solder connects an outer wall of the container and the cover and the metal plate together. The metal plate is formed, at its top surface, with a middle portion, an outer elevated portion and a round concave between the middle portion and the outer elevated portion. The container has a bottom end inserted into the concave to a position where an air gap is defined in the concave below the bottom end of the container. The container is soldered to the metal plate by applying the solder to the outer wall of the container and the elevated outer portion on the top surface of the metal plate. By such design, even if the solder has an tendency to flow into an inside of the container during the soldering process, the molten solder will be finally cooled and stopped from further flowing in the air gap; thus, the contamination of the wick in the container by the molten solder of the prior art is overcome. A method for manufacturing the tower-type heat pipe in accordance with the preferred embodiment of the present invention includes the following steps. First, a metal plate is prepared to have a middle portion, an outer elevated portion and a concave between the middle portion and the outer elevated portion. Second, a container is vertically mounted to the metal plate at position between the middle portion and the outer elevated portion with a bottom end of the container being inserted into the concave wherein an air gap is formed in concave between the bottom end of the container and the metal plate. Third, a wick is applied to an inner wall of the container. Final, a soldering process is performed to solder a cover to a top of the container and an outer wall of the container and the outer elevated portion together. Finally, working fluid is injected into the container and the container is vacuumed through a tube of the cover and then the tube is sealed.

DETAILED DESCRIPTION OF THE EMBODIMENT

Figure 1:
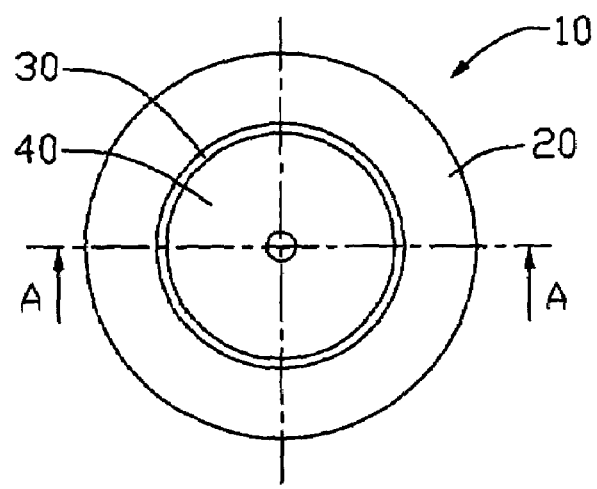
FIG. 1 is a top view of a tower-type heat pipe in accordance with a preferred embodiment of the present invention.

Reference will now be made to the drawing figures to describe the present invention in detail.

Figure 2:
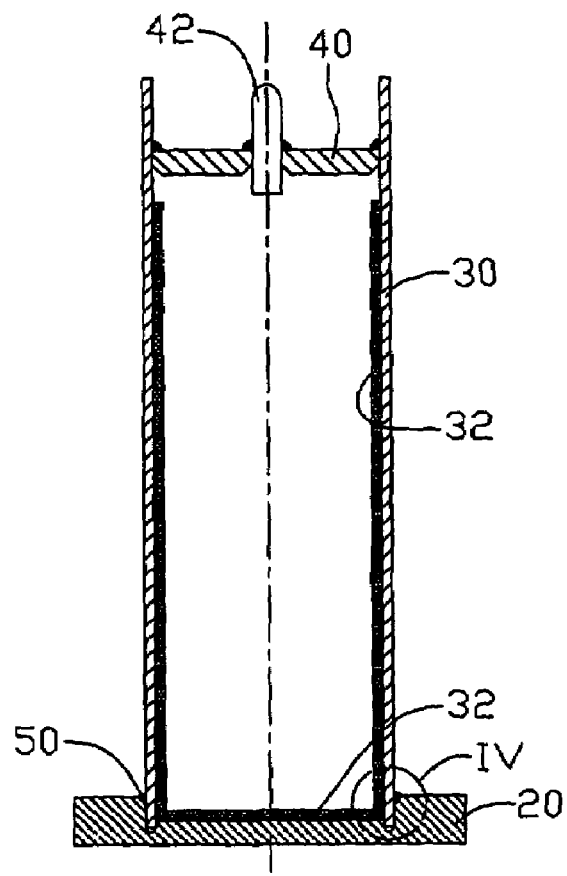
FIG. 2 is a cross-sectional view take from line A—A line of FIG. 1.

Referring FIG. 1 and FIG. 2, a tower-type heat pipe 10 comprises a metal plate 20, a container 30 and a cover 40, wherein the metal plate 20 and the container 30 are made of high heat conductive materials such as copper, aluminum, and metal alloys. In the preferred embodiment of the invention, the shapes of the metal plate 20 and the container 30 are shown as round. However, other shapes such as triangle, square, or polygonal can also be used. The metal plate 20 has a bottom surface (not labeled) for thermally connecting with a heat source, such as a heat-generating electronic device, for example, a CPU.

Figure 3:
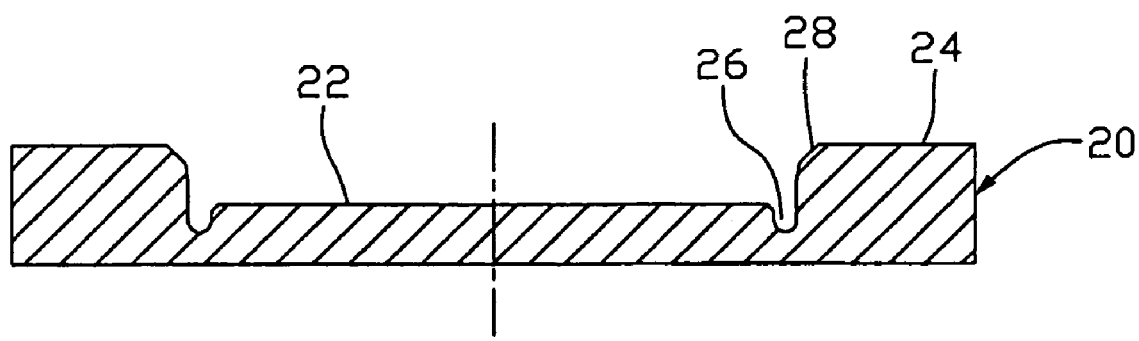
FIG. 3 is an enlarged view of a of a metal plate of the tower-type heat pipe of FIG. 2.

Also referring to FIG. 3, the metal plate 20, on a top surface thereof, has a middle portion 22, an outer elevated portion 24 surrounding the middle portion 22, a concave 26 in the middle portion adjacent to the outer portions 22, 24, and an askew part 28 on a corner of the elevated portion 24 near the middle 22 portion. The elevated portion 24 is higher than the middle portion 22. Also referring to FIG. 4, The container 30 is vertically mounted on the top surface of the metal plate 20 with a bottom end of the container 30 fittingly inserted into the concave 26 to reach a position wherein an air gap 27 is formed in the concave 26 between a bottom edge of the container 30 and the metal plate 20. Solder 50 is used to solder the askew part 28 of the metal plate 20 and an outer wall of the container 30 together.

By the design that the air gap 27 is formed below the bottom edge of the container 30 and the solder is applied to the outer wall of the container 30 and the elevated portion 24, even if during the soldering process the molten solder flows downwardly along an interface between the outer wall of the container 30 and the elevated portion 24, the molten solder will be cooled and stopped from further flowing in the air gap 27. Thus a flowing of the molten solder from the air gap 27 along an interface between the middle portion 22 and an inner wall of the bottom end of the container 30 to enter the container 30 is totally prevented.

Figure 4:
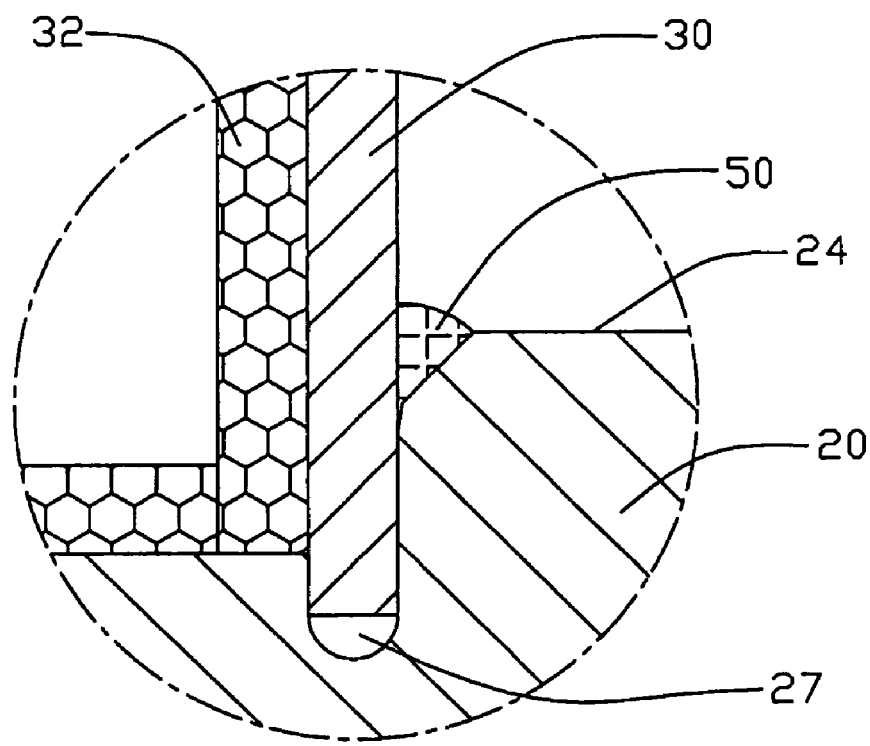
FIG. 4 is an enlarged view of a portion indicated by IV of FIG. 2.

A method for constructing the tower-type heat pipe 10 includes following steps. First the metal plate 20, the container 30 and the cover 40 are prepared. Then the container 30 is mounted on the metal plate 10 in a manner as shown in FIG. 4, but without soldering the metal plate 20 and the container 30 together. Then, a wick 32 is applied to the inner wall of the metal container 30 and the top surface of the metal plate 20 at the middle portion 22. The wick 32 is formed by sintering copper powders or inserting a mesh on the inner wall of the container 30 and the top surface of the middle portion 22. Such a wick formation is well known by those skilled in the art. Thereafter the cover 40 is put on a top of the container 30 and a soldering process is used to solder the cover 40 and the container 30 and the askew part 28 of the metal plate 20 and the outer wall of the container 30 together. The cover 40 has a hollow tube 42 in a middle thereof. After the soldering process, working fluid is injected into the container 30 and the container 30 is vacuumed. Both the injecting and vacuuming operations are conducted through the tube 42. Finally, a top of the tube 42 is sealed to complete the tower-type heat pipe 10 in accordance with the present invention. As mentioned above, by the provision of the air gap 27, the molten solder during the soldering process is totally prevented from flowing upwardly along the interface between the middle portion 22 and the inner wall of the bottom end of the container 30; thus, the contamination of the molten solder to the wick in the prior art is totally solved by the design of the present invention. In other words, in accordance with the present invention, the solder 50 is impossible to enter the container 30 to contaminate the wick 32.

Figure 5:
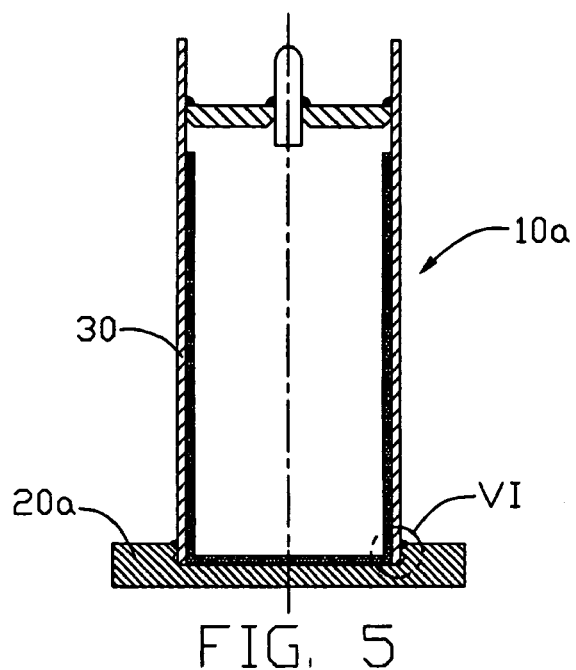
FIG. 5 is a tower-type heat pipe in accordance with a second preferred embodiment of the present invention.
Figure 6:
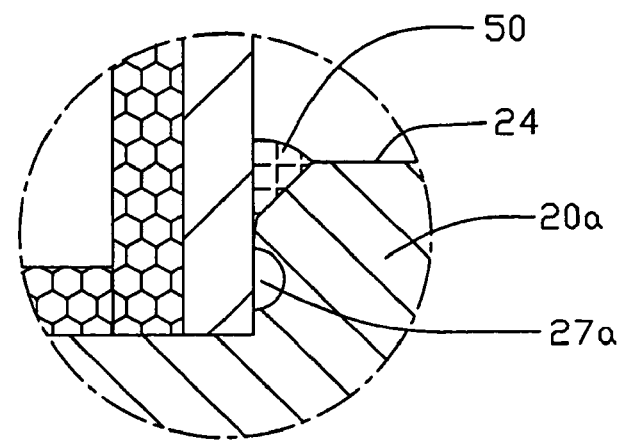
FIG. 6 is an enlarged view of a portion indicated by VI of FIG. 5.

FIG. 5 and FIG. 6 discloses another embodiment of the invention. As shown in FIGS. 5 and 6, a tower-type heat pipe 10a comprises a metal plate 20a, a container 30, and a cover. The metal plate 20a is similar to the metal plate 20 of the first embodiment, except that the metal plate 20a does not have the concave 26 between the elevated portion 24 and the middle portion 22. Instead, in this embodiment, a concave 27a is defined in an inner wall of the elevated portion 24 below the askew part so that when the container 30 is mounted to the middle portion of the metal plate 20a, an air gap is formed by the concave 27a. The air gap is located below the solder 50 so that molten solder which has a tendency to move downwardly along an interface between the outer wall of the container 30 and the inner wall of the elevated portion 24 will be cooled and stopped from further flowing by the air gap 27a. Thus, a contamination of the molten solder to the wick in the container is avoided.

Figure 7:
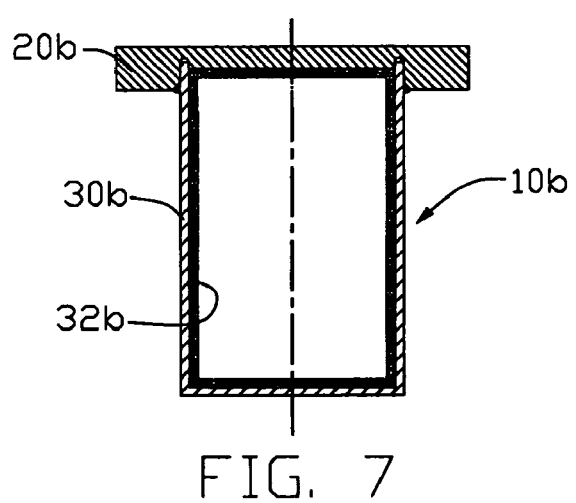
FIG. 7 is a cross-sectional view of a tower-type heat pipe in accordance with a third preferred embodiment of the present invention.

FIG. 7 shows a third preferred embodiment of the invention. The third embodiment discloses a tower-type heat pipe 10b which is the same as tower-type heat pipe 10 of the first embodiment regarding the structure for soldering the container 30b to the metal plate 20b. However, in this embodiment, a wick 32b is applied to inner walls of the container 30b and the cover and the middle portion of the metal plate 20b. The heat pipe 10b is used in an upside down manner in comparison with the heat pipe 10 of the first embodiment. That is the cover of the heat pipe 10b is used to contact with the heat source.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

I claim:

1. A cooling device comprising;
   a metal plate having a middle portion and an outer elevated portion;
   a container vertically mounted on the metal plate between the outer elevated portion and the inner portion, having a wick applied to an inner wall thereof and working fluid therein;
   a cover sealing a top of the container; and
   solder soldering an outer wall of the container and the outer elevated portion together; wherein
   an air gap is defined between the solder and the wick in order to prevent the solder from flowing into an inside of the container to contaminate the wick thereof.

2. The cooling device of claim 1 wherein a concave is defined in the middle portion and the air gap is formed in the concave between a bottom edge of the container and the metal plate.

3. The cooling device of claim 1 wherein the air gap is defined in the outer elevated portion and below the solder.

4. The cooling device of claim 2 wherein the container has a bottom end extending into the concave of the said metal plate.

5. The cooling device of claim 2 wherein the metal plate is provided with a wick integrating with the wick applied to the inner wall of the container.

6. The cooling device of claim 1 wherein an askew part is defined on the outer elevated portion adjacent to the middle portion, the solder soldering the askew part to the outer wall of the container.

7. A method for manufacturing a cooling device for an electronic device, comprising the following steps:
   preparing a metal plate having a middle portion, an outer elevated portion and a concave;
   vertically mounting a container to the metal plate located between the middle portion and the outer elevated portion, wherein an air gap is formed by the concave between the container and the outer elevated portion;
   applying a wick to an inner wall of the container;
   soldering a cover to a top of the container and an outer wall of the container and the outer elevated portion together;
   injecting working fluid into and vacuuming the container through the cover; and
   sealing the cover.

8. The method of claim 7, wherein the concave is defined in the middle portion adjacent to the outer elevated portion.

9. The method of claim 8, wherein the concave is defined in the outer elevated portion just below a location where the outer wall of the container is soldered to the outer elevated portion.

10. The method of claim 7, wherein the container is made of copper.

11. The method of claim 7, wherein the wick is also applied to the middle portion of the metal plate.

12. The method of claim 7, wherein the wick is formed by one of sintering copper powers and inserting a mesh on the inner wall of the container.

13. A heat pipe comprising:
    a metal plate defining a middle portion, an outer elevated portion and a concave in the middle portion adjacent to the outer elevated portion;
    a container vertically mounted on the metal plate, having a bottom end inserted into the concave to a position in which an air gap is defined below a bottom edge of the container;
    a wick being applied to an inner wall of the container;
    working fluid received in the container; and
    solder being applied to an outer wall of the container and the outer elevated portion of the metal plate to connect the container and the metal plate together.

14. The heat pipe in accordance with claim 13 further comprising a wick applied to the middle portion of the metal plate.

15. The heat pipe in accordance with claim 14, wherein the outer elevated portion has an askew part in a corner thereof near the middle portion, and the solder soldering the container and the metal plate together is applied to the askew part.

* * * * *